United States Patent
Colinge et al.

(10) Patent No.: US 7,253,043 B2
(45) Date of Patent: Aug. 7, 2007

(54) SHORT CHANNEL SEMICONDUCTOR DEVICE FABRICATION

(75) Inventors: Jean-Pierre Colinge, Carmichael, CA (US); Weize Xiong, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 224 days.

(21) Appl. No.: 11/152,596

(22) Filed: Jun. 14, 2005

(65) Prior Publication Data

US 2006/0281268 A1 Dec. 14, 2006

(51) Int. Cl.
*H01L 21/336* (2006.01)
(52) U.S. Cl. ................. 438/197; 438/157; 438/283
(58) Field of Classification Search ............. 438/197, 438/151, 157, 176, 195, 283; 257/347, 334, 257/344, 408
See application file for complete search history.

(56) References Cited

U.S. PATENT DOCUMENTS

| | | | |
|---|---|---|---|
| 5,539,930 | A | 7/1996 | Sesselmann |
| 5,585,107 | A | 12/1996 | Vickers |
| 5,678,247 | A | 10/1997 | Vickers |
| 5,983,913 | A | 11/1999 | Fargason |
| 6,009,673 | A | 1/2000 | Adams |
| 6,284,608 | B1 | 9/2001 | Krivakapic et al. |
| 2004/0197970 | A1* | 10/2004 | Komatsu ................. 438/163 |
| 2005/0051812 | A1* | 3/2005 | Dixit et al. ............. 257/250 |
| 2005/0095764 | A1* | 5/2005 | Chambers et al. ........ 438/197 |
| 2005/0116218 | A1* | 6/2005 | Yang ...................... 257/19 |

OTHER PUBLICATIONS

"Accumulation-Mode Pi-gate MOSFET", J.W. Park, W. Xiong and J.P. Colinge, SOI Conference, 2003, 3 pgs.
"Investigation of Deep Submicron Single and Double Gate SOI MOSFETs in Accumulation Mode for Enhanced Performance", E. Rauly, B. Iñiguez and D. Flandre, Electrochemical and Solid-State Letters, 4 (3) G28-G30, 2001, 3 pgs.
"5nm-Gate Nanowire FinFET", Fu-Liang Yang et al., IEEE symposium on FLSI Technology Digest of Technical Papers, 2004, 2 pgs.
*Silicon-On Insulator Technology*, Chapter 5 "The SOI MOSFET", J.P. Colinge, Kluwer Academic Publishers, 1991, 95 pgs.
*Silicon-On Insulator Technology*, Chapter 6 "Other SOI Devices", J.P. Colinge, Kluwer Academic Publishers, 1991, 53 pgs.

* cited by examiner

*Primary Examiner*—Tuan H. Nguyen
(74) *Attorney, Agent, or Firm*—Peter K. McLarty; W. James Brady, III; Frederick J. Telecky, Jr.

(57) ABSTRACT

The formation of one or more accumulation mode multi gate transistor devices is disclosed. The devices are formed so that short channel effects are mitigated. In particular, one more types of dopant materials are implanted in a channel region, an extension region and/or source/drain regions to mitigate the establishment of a conduction path and the accumulation of electrons in the channel region that can result in an unwanted leakage current.

20 Claims, 15 Drawing Sheets

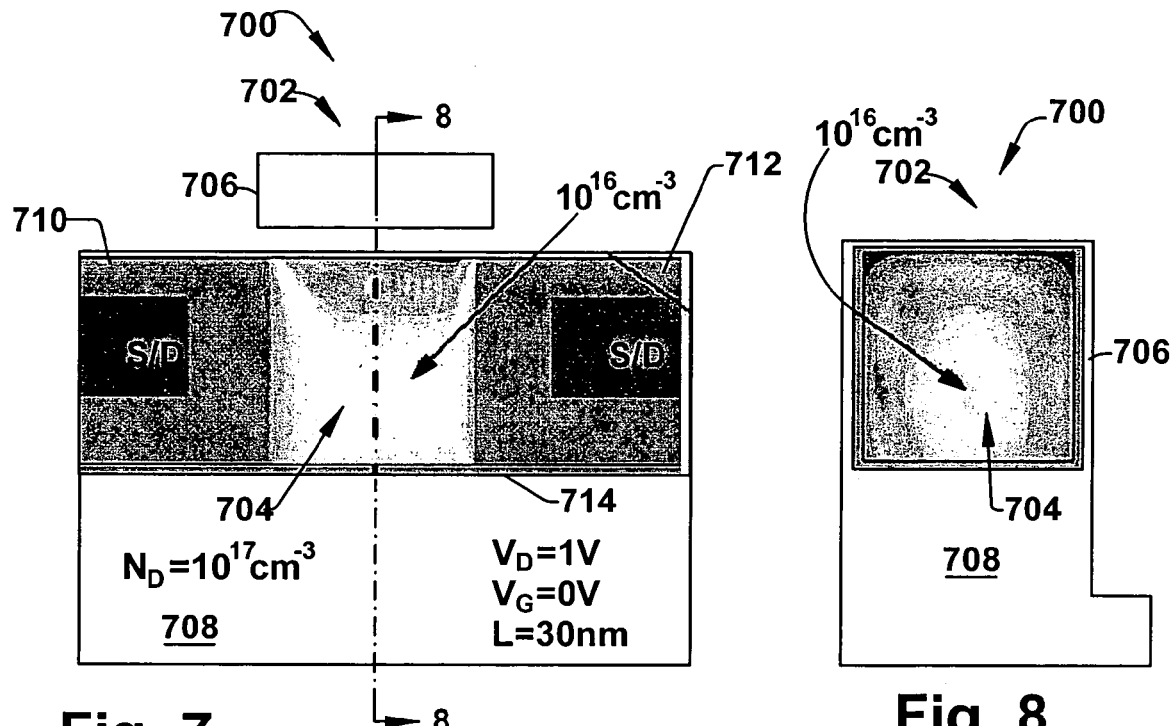
Fig. 7
PRIOR ART
Fig. 8
PRIOR ART
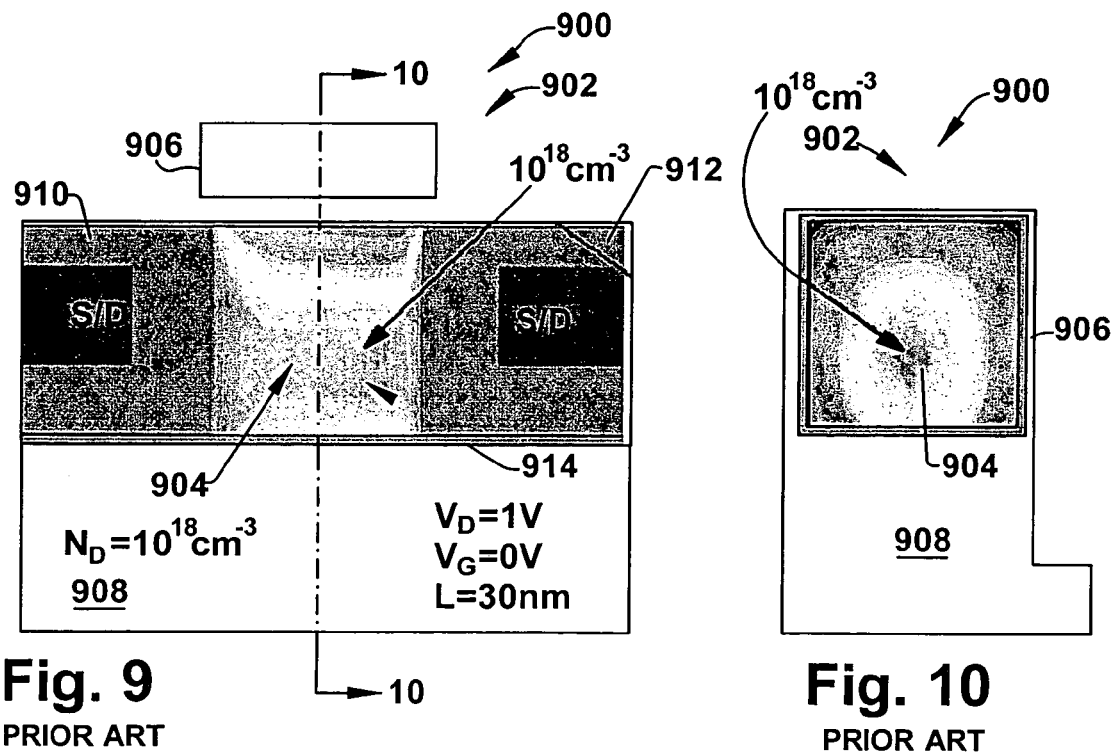
Fig. 9
PRIOR ART
Fig. 10
PRIOR ART

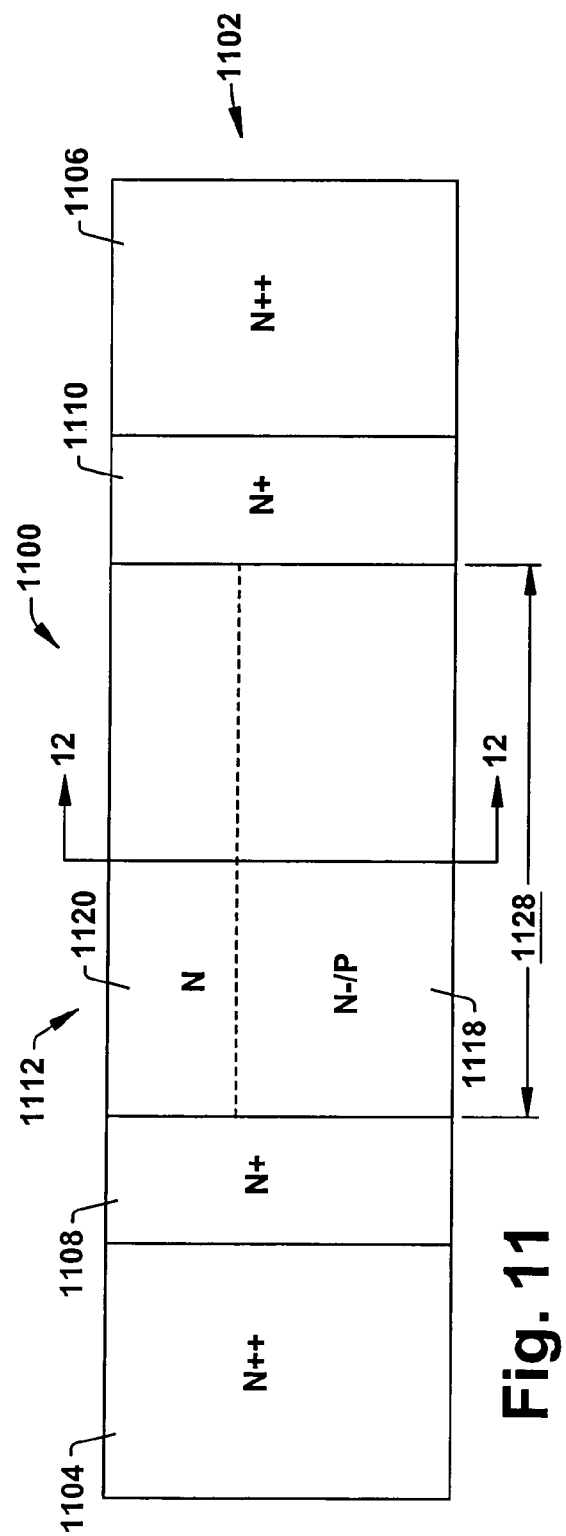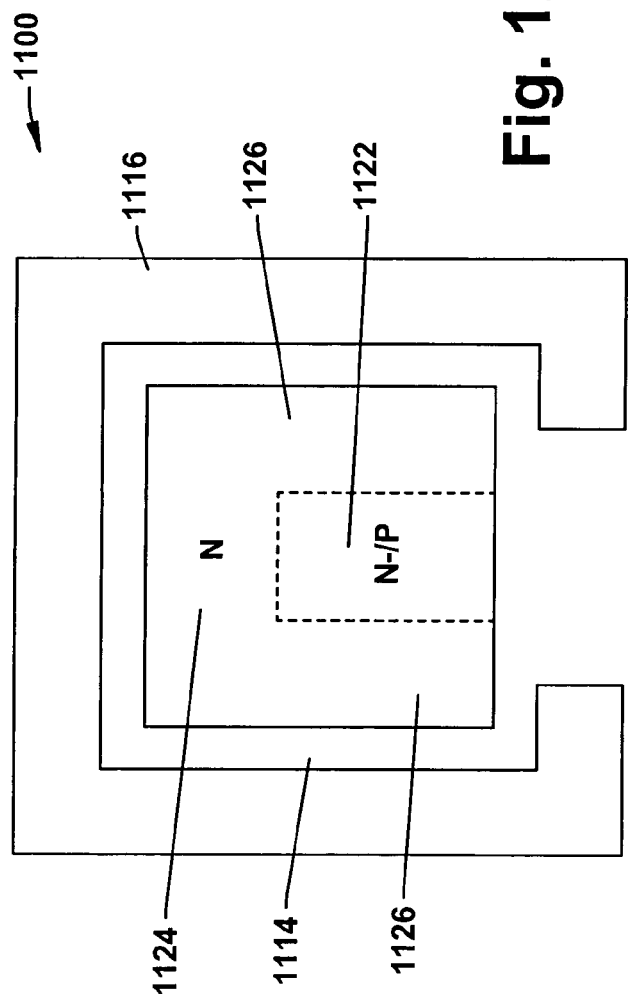

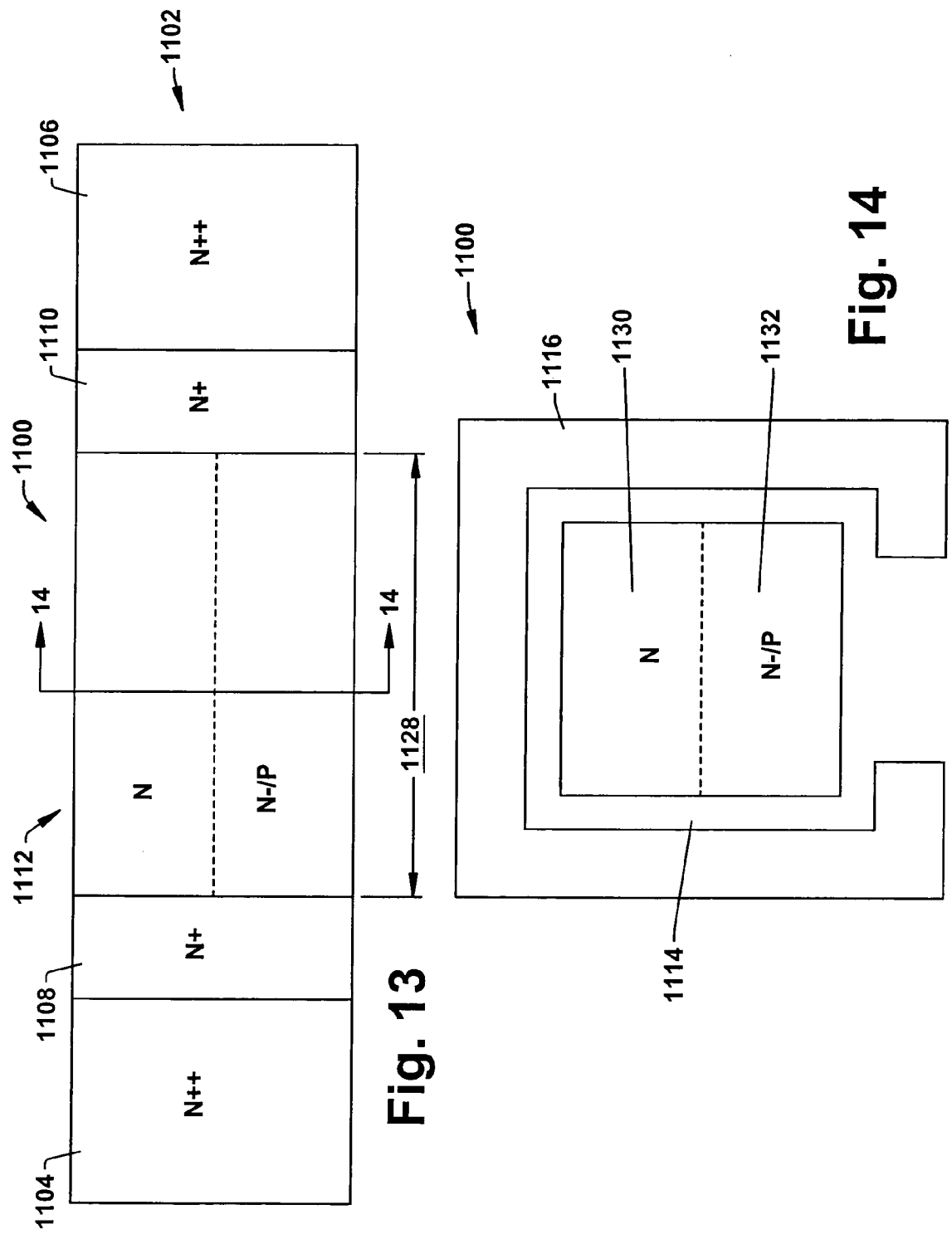

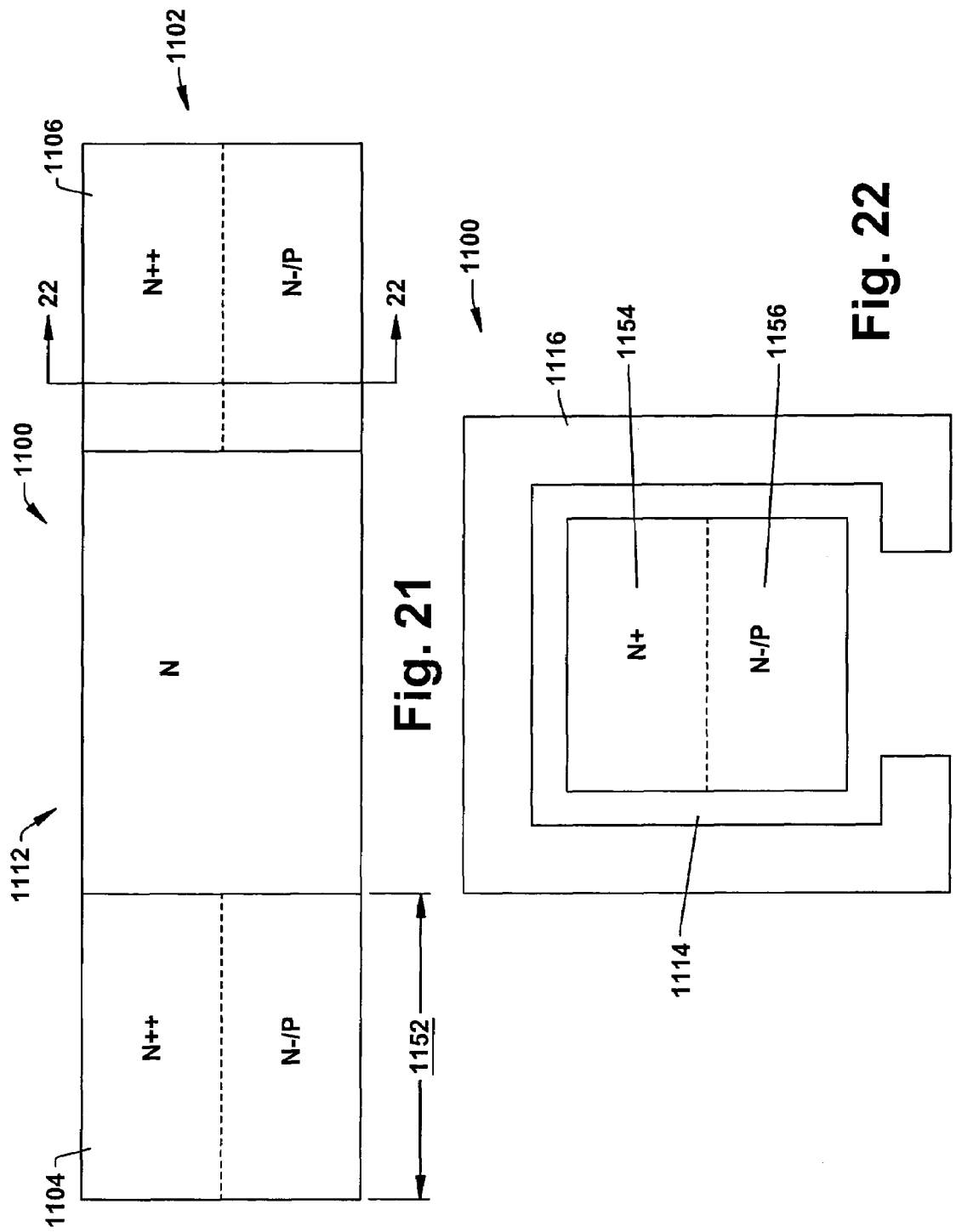

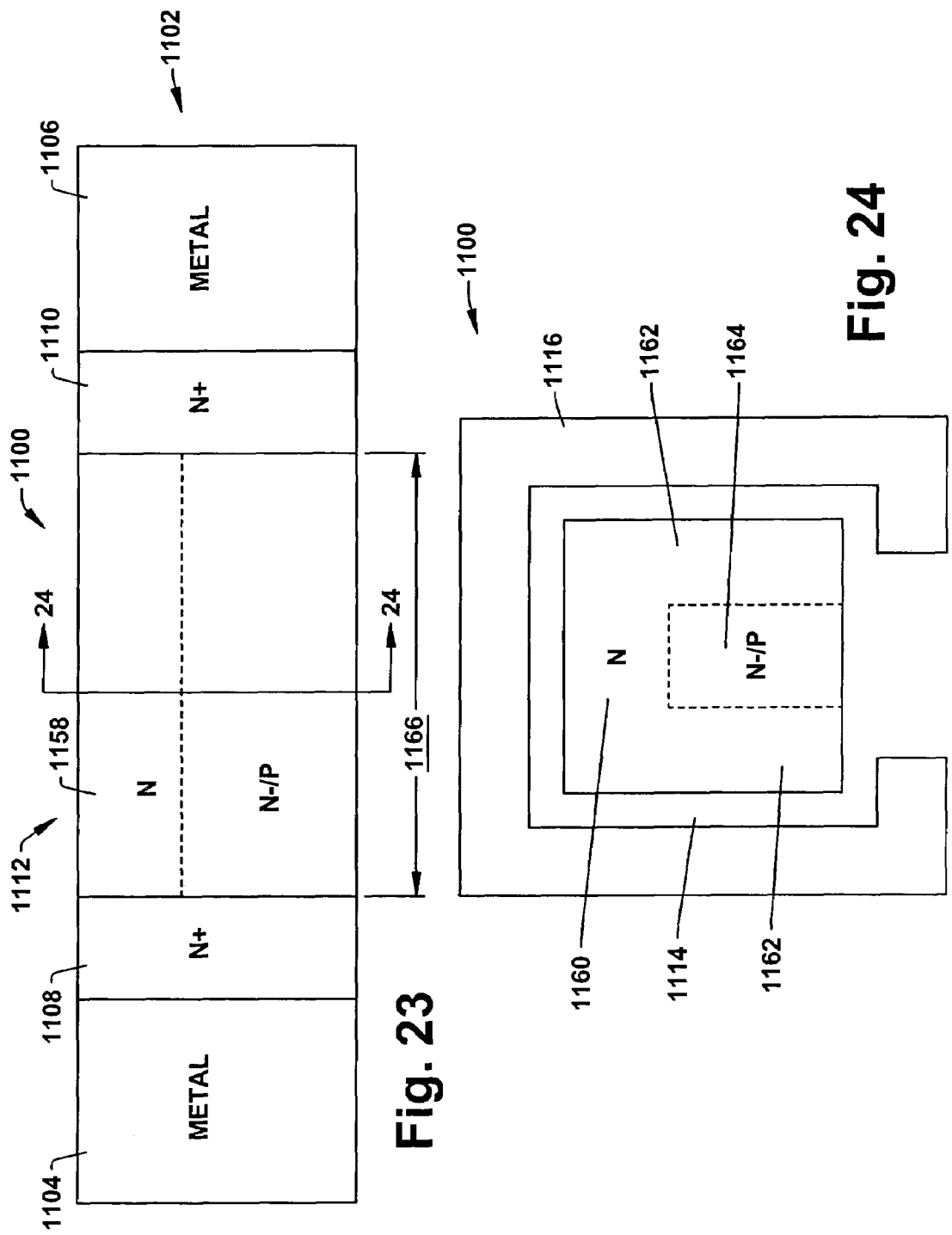

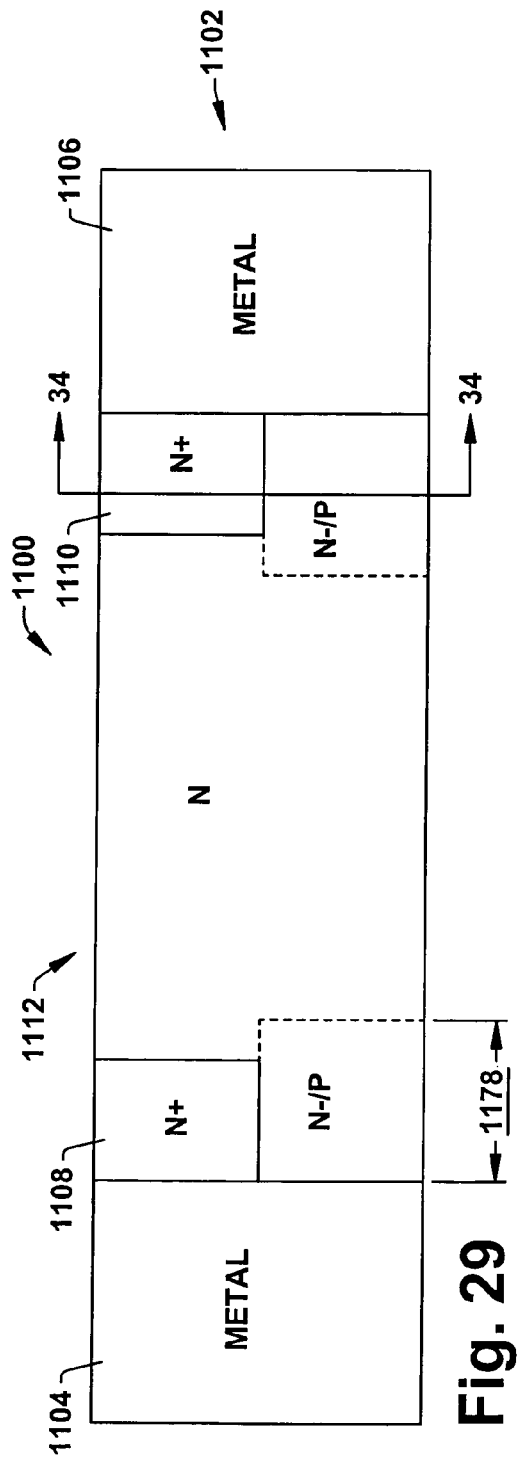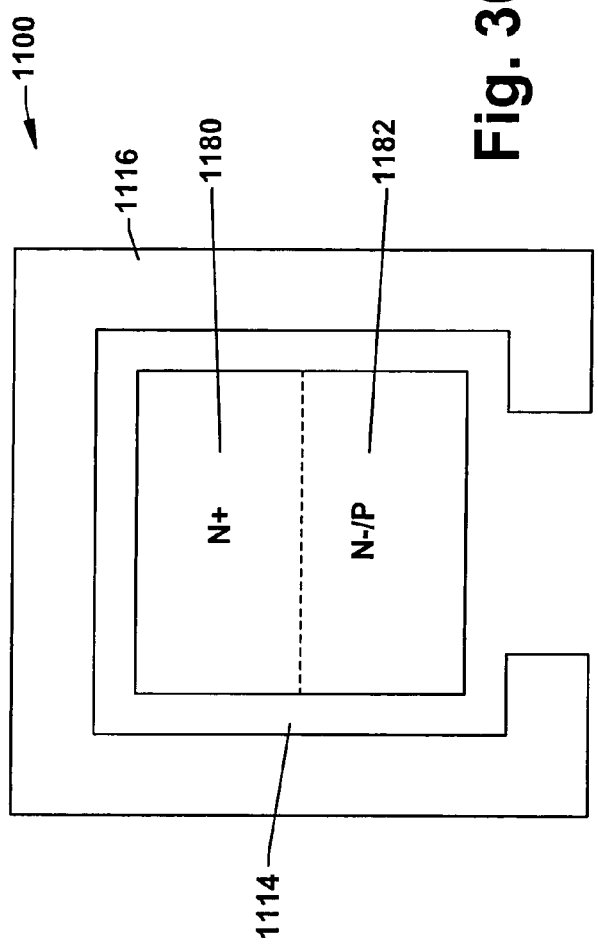

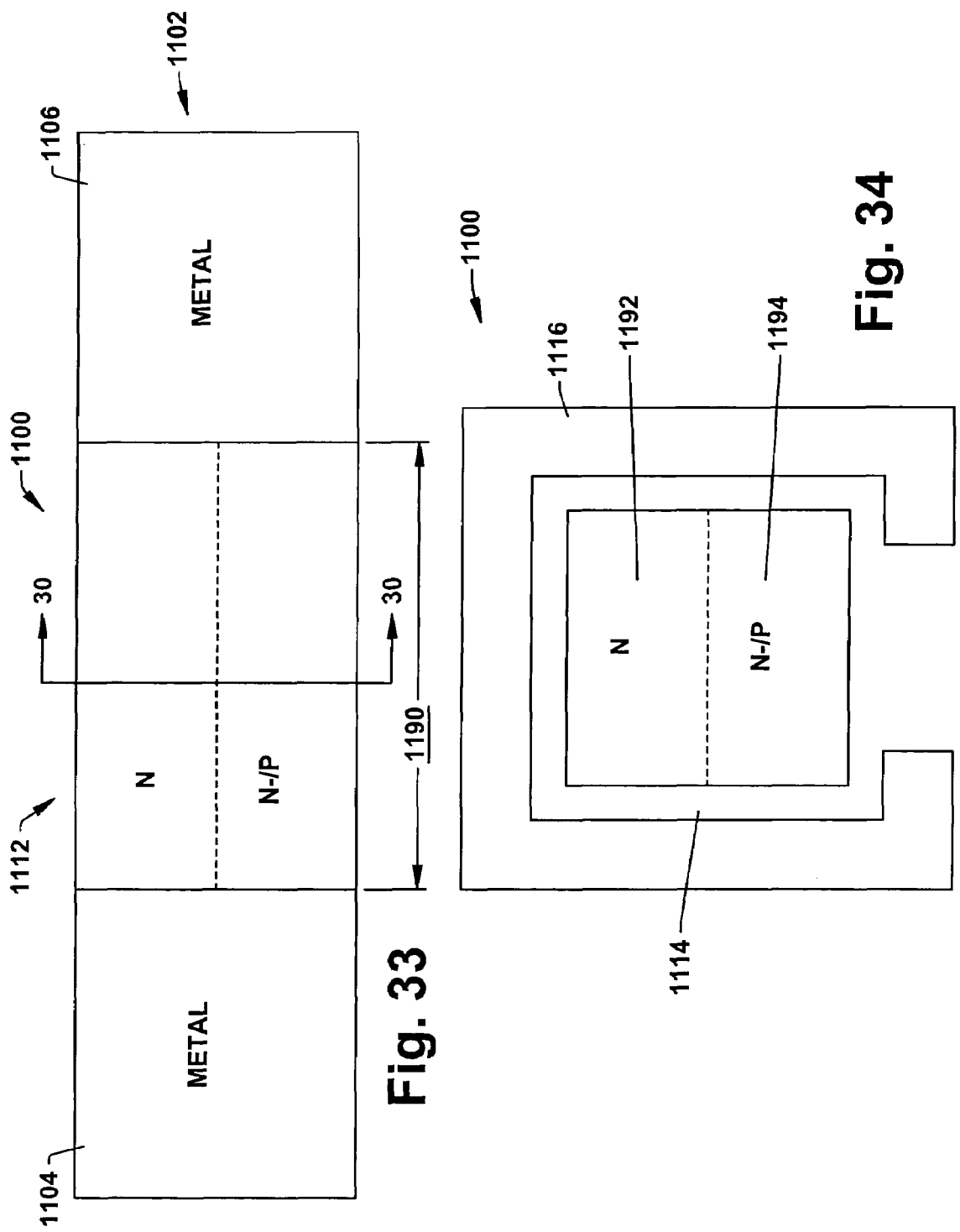

SHORT CHANNEL SEMICONDUCTOR DEVICE FABRICATION

FIELD OF INVENTION

The present invention relates generally to semiconductor devices, and more particularly to fabricating a semiconductor device having a short channel region.

BACKGROUND OF THE INVENTION

Metal oxide semiconductor field effect transistors (MOSFETs) are widely used in the electronics industry for switching, amplification, filtering, and other tasks related to both analog and digital electrical signals. Conventional planar MOS transistors include a gate structure or stack formed on a semiconductor substrate. The gate stack generally includes a thin gate dielectric overlying the substrate and a gate electrode situated over the gate dielectric. Source and drain regions are formed in the substrate on either side of the gate structure, thereby defining a channel region at the upper surface of the substrate under the gate structure.

In operation, the gate electrode is energized to create an electric field in the channel region of the substrate, thus inverting a thin portion of the channel underneath the gate dielectric and allowing minority carriers to travel through the channel between the source/drain regions. The threshold voltage (Vt) of a transistor is the gate voltage value required to render the channel conductive by formation of an inversion layer (e.g., in which the concentration of minority carriers exceeds that of majority carriers) at the surface of the semiconductor substrate under the gate stack.

Scaling is a continuing process in the manufacture and design of semiconductor products, wherein electrical device feature sizes are being reduced to increase device density, improve performance (e.g., increase switching speed), and to reduce power consumption, for example. It is desirable, for instance, to scale or reduce the length of the transistor gate stack and hence the length of the channel between the source and drain regions, to increase drive current performance, particularly for operation with reduced gate voltages. The length of the gate structure is typically the smallest dimension in a planar transistor. However, lithography generally limits the extent to which transistor dimensions can be reliably scaled, wherein the minimum gate length is typically limited to the smallest dimension that can be repeatably patterned and etched using current photolithographic and etching techniques.

In addition to fabrication process limitations, performance limitations are also a barrier to scaling conventional planar transistor dimensions, particularly the gate length. For example, as the gate length is reduced, the transistor performance may be degraded by short channel effects. In devices having longer channels, the gate voltage and the resulting field primarily control the depletion of charge under the gate. In shorter channel devices, however, the channel region is also affected by the source and drain voltages, leading to increased off state current due to Vt roll off, degraded subthreshold slope, and degraded output current. In addition, since less gate voltage is needed to deplete the shortened channel, the barrier for electron injection from the source to the drain decreases, a situation sometimes referred to as drain induced barrier lowering (DIBL).

As the performance and process limitations on scaling planar transistors are reached, attention has been recently directed to transistor designs having "multiple gates" (e.g., non planar MOS transistors). In theory, these designs provide more control over a scaled channel by situating the gate electrode, around two or more sides of the channel, whereby a shorter channel length can be achieved for the same gate dielectric thickness or similar channel lengths can be used with thicker gate dielectrics. This generally provides for improved current drive and short channel characteristics due to the additional control afforded by the increased amount of gate electrode material.

FIGS. 1 and 2 illustrate examples of some multiple gate transistor designs, which are generally named after the shape of their respective gate structures. Dual and triple gate transistors 102 and 104 are respectively illustrated in FIG. 1, while a quad gate transistor 106, and a "PI" gate transistor 108 are presented in FIG. 2. The transistors are formed in a silicon over insulator (SOI) wafer 110, which includes a silicon substrate 112 with an overlying oxide insulator 114 and a 20.0-50.0 nm thick semiconductor layer (not shown) above the oxide 114. In forming the transistors, the upper semiconductor layer is etched away, leaving isolated islands or blocks 116 of semiconductor material, and a gate structure (G) is formed over the silicon blocks 65, with the ends of the blocks 116 being doped to form source (S) and drain (D) regions therein, as illustrated in FIGS. 1 and 2. Multi gate designs offer the prospect of improved transistor performance by alleviating short channel effects seen in scaled planar transistors. This is due primarily to the ability to control the electric field the channel silicon because the gate extends on more than one peripheral side of the channel.

In addition to inversion mode multi gate transistors, accumulation mode multi gate devices are also being explored as yet a further extension of alternative transistor designs. Accumulation mode transistor devices generally offer high current drive and reduced short channel effects, where the threshold voltage in such devices is limited by the amount of doping atoms that can be placed in the small channel region volume and by the choice of available gate materials. As such, the use of accumulation mode structures increases the range of available threshold voltages and offers additional performance in deep submicron structures, especially as the use of Schottky source and drain devices is contemplated.

In operation, when an accumulation mode transistor is turned on an accumulation layer is formed at he top, left and right interfaces of the device. At the same time, the body (or the "volume") of the device is quasi neutral (i.e., not depleted). The total current in the device is the sum of the current in the accumulation channels and in the neutral body. When the device is turned off, the depletion regions arising from the interfaces meet near the center of the device and pinch off the quasi neutral piece of silicon connecting the source and drain regions. This pinch off mechanism works well as long as the amount of dopant atoms remains relatively low. An increased dopant concentration, however, can result in a sufficient number of electrons (or electron concentration) being present in the channel region so that a leakage current develops in the channel region. This is particularly, true as scaling progresses and channel lengths are resultantly decreased. It will be appreciated that while the case of an n-channel device is discussed herein, the general principles described also apply to p-channel devices, provided that the appropriate polarity changes are applied to the dopant atoms and applied biases.

This is illustrated in FIGS. 3-10 wherein different channel lengths and dopant concentrations are illustrated that may (or may not) culminate in leakage currents. In FIGS. 3 and 4, for example, a first PI gate accumulation mode multi gate transistor device 300 is illustrated, where FIG. 4 is a cross sectional view of FIG. 3 taken along lines 4-4. The transistor device 300 has a gate structure 302 that overlies a channel region 304. Gate electrode material 306 of the gate structure 302 extends into a buried oxide 308 of the transistor 300, and source (S) and drain (D) regions 310, 312 of the transistor 300 are located on either side of the channel region 304. The gate electrode material 306 is not shown in FIG. 4. In this example, the channel 304 has a length of L=80 nm and a doping concentration of $10^{17}$ cm$^{-3}$. In this situation, a conduction path 314 does not fully connect or does not form in the channel region 304. As such, the relatively long channel length and the relatively low dopant concentration results in little to no electrons in the channel region, and the likelihood of a leakage current developing therein is therefore virtually nonexistent when the device is off ($V_G$=0V and $V_D$=1V).

In FIGS. 5 and 6, a second PI gate accumulation mode multi gate transistor device 500 is illustrated, where FIG. 6 is a cross sectional view of FIG. 5 taken along lines 6-6. The transistor device 500 once again has a gate structure 502 that overlies a channel region 504, with gate electrode material 506 of the gate structure 502 extending into a buried oxide 508 of the transistor 500, and source (S) and drain (D) regions 510, 512 of the transistor 500 being located on either side of the channel region 504. The gate electrode material 506 is not shown in FIG. 6. In this example, the channel region 504 again has a length of L=80 nm, but the doping concentration is increased to $10^{18}$ cm$^{-3}$. In this situation, a conduction path 514 may begin to develop within the channel region 504. Even with the increased dopant concentration, however, the relatively long channel length still provides enough separation between the source region 510 and the drain regions 512 so that the number of electrons in the channel region 504, if any, remains relatively insufficient to cause a leakage current to develop in the channel region 504 when the device 500 is off ($V_G$=0V and $V_D$=1V).

FIGS. 7 and 8 illustrate a third PI gate accumulation mode multi gate transistor device 700, where FIG. 8 is a cross sectional view of FIG. 7 taken along lines 8-8. A gate structure 702 of the transistor device 700 overlies a channel region 704, with gate electrode material 706 of the gate structure 702 extending into a buried oxide 708 of the transistor 700. Source (S) and drain (D) regions 710, 712 of the transistor 700 are located on either side of the channel region 704. The gate electrode material 706 is not shown in FIG. 8. In this example, the length of the channel region 704 is reduced to L=30 nm, with the doping concentration at $10^{17}$ cm$^{-3}$. In this situation, a more pronounced conduction path 714 is developed in the channel region 704 and the reduced channel length allows a concentration of $10^{16}$ cm$^{-3}$ electrons to build up in the channel region 704. Nevertheless, this electron accumulation still may be insufficient for a leakage current to develop in the channel region 704 when the device 700 is off ($V_G$=0V and $V_D$=1V).

FIGS. 9 and 10 illustrate a fourth and final example of a PI gate type accumulation mode multi gate transistor device 900, where FIG. 10 is a cross sectional view of FIG. 9 taken along lines 10-10. A gate structure 902 of the transistor device 900 overlies a channel region 904 of the device 900. Gate electrode material 906 of the gate structure 902 extends into a buried oxide 908 of the transistor 900, and source (S) and drain (D) regions 910, 912 of the transistor 900 are located on either side of the channel region 904. The gate electrode material 906 is not shown in FIG. 10. In this example, the length of the channel region 904 is again reduced to L=30 nm, with the doping concentration elevated back up to $10^{18}$ cm$^{-3}$. In this situation, a substantial conduction path 914 is established in the channel region whereby a virtually equivalent number of electrons are able to accumulate in the channel region 904 giving rise to an unwanted leakage current in this region when the device 900 is off ($V_G$=0V and $V_D$=1V).

Accordingly, there remains a need for improved transistor devices and manufacturing techniques to realize the advantages of scaling while mitigating or avoiding short channel effects, such as the formation of leakage paths, for example, particularly where an increased doping concentration is implemented in accumulation mode multi gate transistor devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention pertain to forming accumulation mode multi gate transistor devices so that short channel effects are mitigated. In particular, one more types of dopant materials are implanted in a channel region, one or more extension regions and/or a source or drain region of the transistor to mitigate the establishment of a conduction path and the accumulation of electrons in the channel region that can result in an unwanted leakage current.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 7 is a cross sectional view illustrating a third exemplary multi gate transistor device having a reduced channel length and a relatively mild doping concentration.

FIG. 8 is a cross sectional view of the transistor in FIG. 7 taken along lines 8-8.

FIG. 9 is a cross sectional view illustrating a fourth exemplary multi gate transistor device having a reduced channel length and a heavier doping concentration.

FIG. 10 is a cross sectional view of the transistor in FIG. 9 taken along lines 10-10.

FIG. 11 is a side view illustration of a first exemplary accumulation mode multi gate transistor device formed in accordance with one or more aspects of the present invention.

FIG. 12 is a cross sectional illustration of the transistor in FIG. 11 taken along lines 12-12.

FIG. 13 is a side view illustration of a second exemplary accumulation mode multi gate transistor device formed in accordance with one or more aspects of the present invention.

FIG. 14 is a cross sectional illustration of the transistor in FIG. 13 taken along lines 14-14.

FIG. 21 is a side view illustration of a sixth exemplary accumulation mode multi gate transistor device formed in accordance with one or more aspects of the present invention.

FIG. 22 is a cross sectional illustration of the transistor in FIG. 21 taken along lines 22-22.

FIG. 23 is a side view illustration of a seventh exemplary accumulation mode multi gate transistor device formed in accordance with one or more aspects of the present invention.

FIG. 24 is a cross sectional illustration of the transistor in FIG. 23 taken along lines 24-24.

FIG. 29 is a side view illustration of a tenth exemplary accumulation mode multi gate transistor device formed in accordance with one or more aspects of the present invention.

FIG. 30 is a cross sectional illustration of the transistor in FIG. 29 taken along lines 30-30.

FIG. 33 is a side view illustration of a twelfth exemplary accumulation mode multi gate transistor device formed in accordance with one or more aspects of the present invention.

FIG. 34 is a cross sectional illustration of the transistor in FIG. 33 taken along lines 34-34.

DETAILED DESCRIPTION OF THE INVENTION

Figure 1:
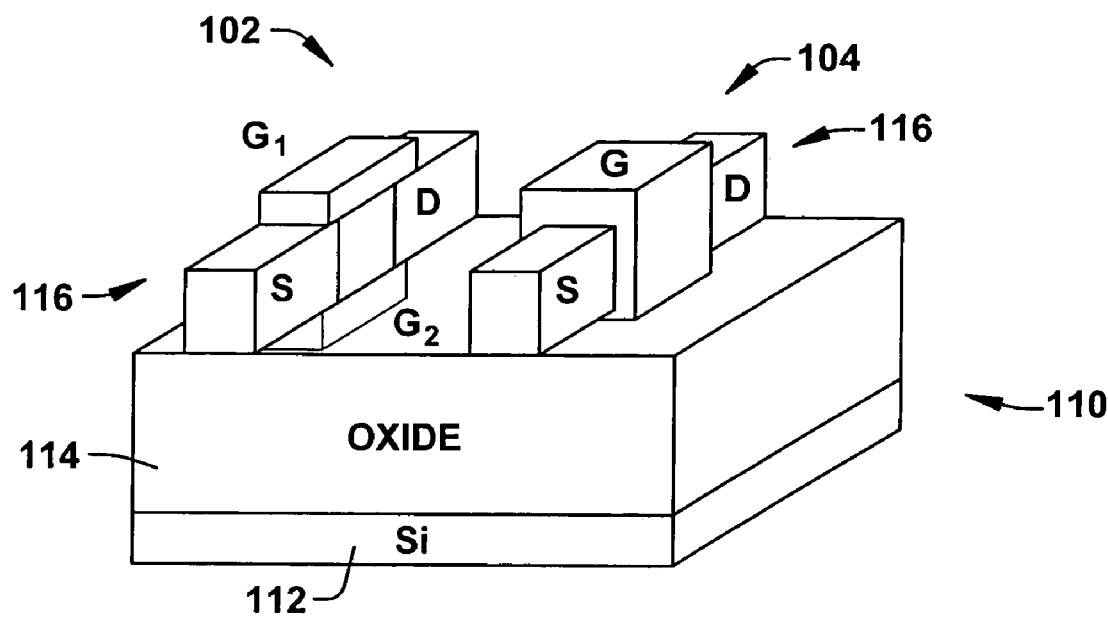
FIG. 1 is a perspective view illustrating examples of multi gate transistor designs, including dual and triple gate transistors.
Figure 2:
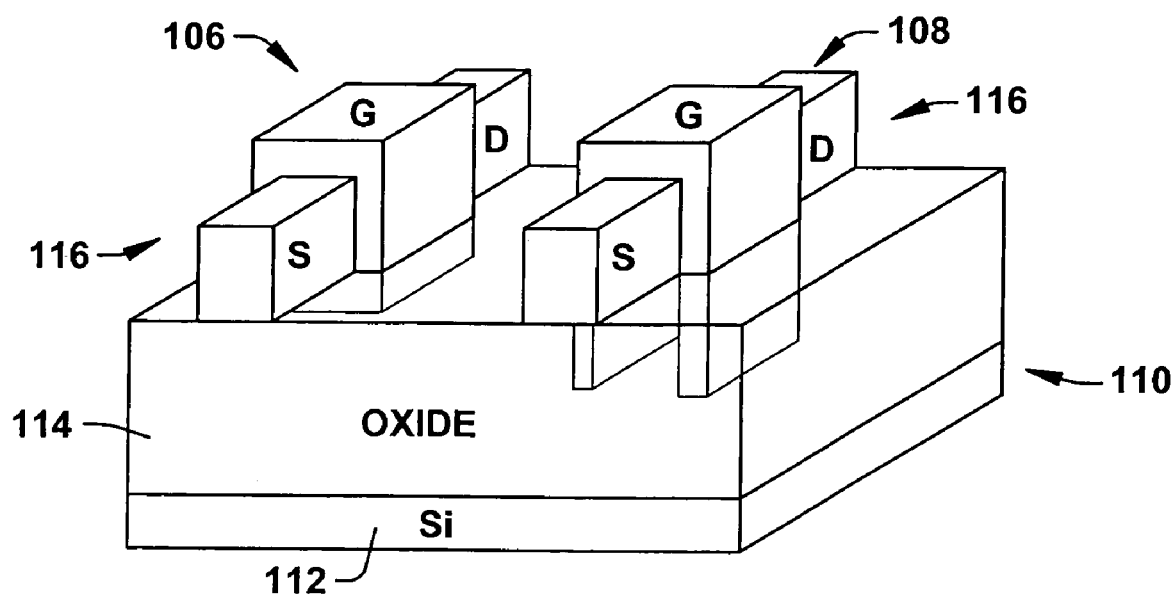
FIG. 2 is a perspective view illustrating examples of other multi gate transistor designs, including quad gate and "PI" gate transistors.
Figure 3:
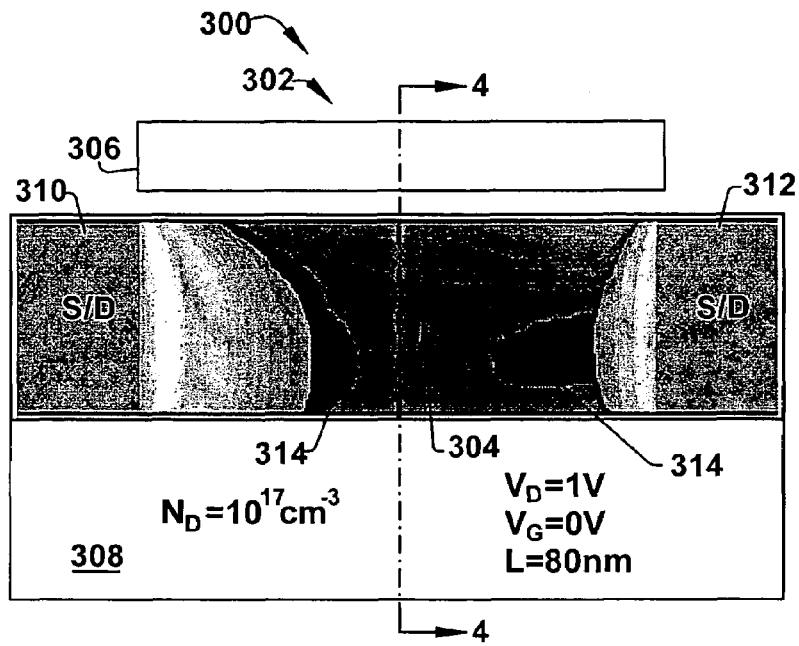
FIG. 3 is a cross sectional view illustrating a first exemplary multi gate transistor device having a relatively long channel region and a relatively mild doping concentration.
Figure 4:
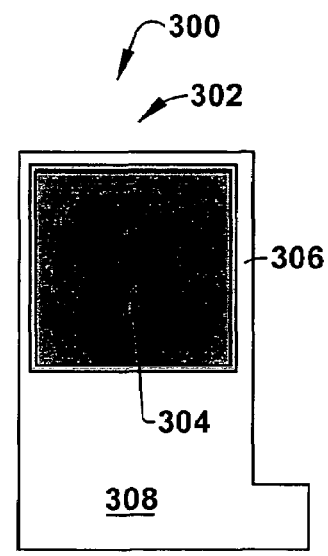
FIG. 4 is a cross sectional view of the transistor in FIG. 3 taken along lines 4-4.
Figure 5:
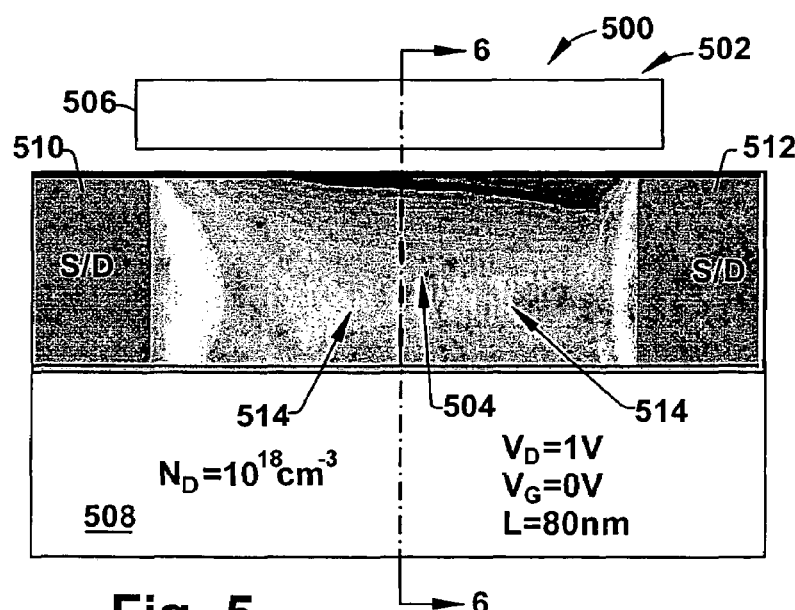
FIG. 5 is a cross sectional view illustrating a second exemplary multi gate transistor device having a relatively long channel and a heavier doping concentration.
Figure 6:
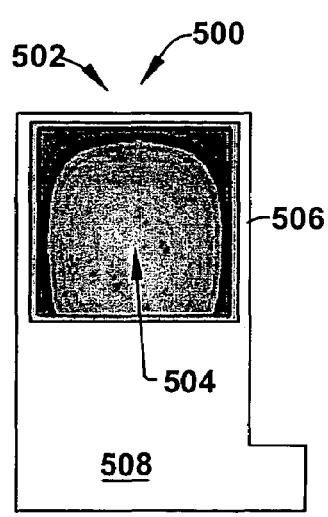
FIG. 6 is a cross sectional view of the transistor in FIG. 5 taken along lines 6-6.

One or more aspects of the present invention are described with reference to the drawings, wherein similar or like reference numerals or characters are generally utilized to refer to similar or like elements, structures, features, components, etc. throughout, and wherein what is depicted herein is not necessarily drawn to scale. It will be appreciated that where like acts, events, elements, features, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

FIG. 11 is a side view illustration of a first exemplary accumulation mode multi gate transistor device 1100 formed in accordance with one or more aspects of the present invention, and FIG. 12 depicts the transistor 1100 in cross section taken along lines 12-12. In FIG. 11 a cross section of a semiconductor substrate 1102 is depicted where source 1104 and drain 1106 regions, extension regions 1108, 1110 and a channel region 1112 are formed within the substrate 1102. It can be seen in FIG. 12 (not shown in FIG. 11) that a thin gate dielectric 1114 and a gate electrode 1116 surround the channel region 1112 in this multi gate embodiment. Additionally, some of the gate electrode 1116 may extend into a buried oxide (not shown) on the substrate 1102. It will be appreciated that 'substrate' as referred to herein may comprise any type of semiconductor body (e.g., silicon, SiGe, SOI) such as a semiconductor wafer or one or more die on a wafer, as well as any other type of semiconductor and/or epitaxial layers associated therewith.

According to one or more aspects of the present invention, a portion of the channel region 1112 is doped to mitigate short channel effects. This doping retards the establishment of a conduction path in the channel region 1112, and thereby limits the accumulation of electrons within the channel that can lead to an unwanted leakage current. In the illustrated example, a lower portion 1118 of the channel region 1112 has a first lower concentration of dopants (N− or P), while an upper portion 1120 of the channel region 1112 has a second slightly increased concentration of dopants (N). The extension regions 1108, 1110 have a third higher concentration of dopants (N+), and the source 1104 and drain 1106 regions have a fourth highest concentration of dopants (N++).

Referring to FIG. 12, it can be seen that (in this example) merely the bottom center 1122 of the channel region 1112 has the first lower dopant concentration (N− or P). This can be achieved by utilizing a tilted implantation process. For example, the entire substrate can initially be uniformly doped by a first implantation process with the first lower dopant concentration (N− or P). A second tilted implantation process can then be used to selectively dope the top 1124 and sidewalls 1126 of the channel region 1112 to achieve the second dopant concentration of N. It is to be appreciated that although the entire length 1128 of the channel region 1112 is depicted as being doped in the illustrated example, that this entire length 1128 does not need to be doped to mitigate short channel effects. Rather, merely enough of the channel region 1112 has to be doped to interrupt the formation of a conduction path therein. This may, for example, correspond to a length of about one half the length 1128.

Stated another way, the entire silicon region 1112 is first doped to achieve a low concentration that is essentially equal to the final concentration in region 1118. Then additional impurities are added using a tilted ion implantation process to achieve a higher doping concentration in regions 1124 and 1126 in FIG. 12, which also corresponds to region 1120 in FIG. 11.

Once the channel region 1112 is sufficiently doped, the gate dielectric 1114 and gate electrode 1116 (not illustrated in FIG. 11) are formed over the channel region 1112. As an alternative, the additional dopants used to achieve a higher doping concentration in regions 1124 and 1126 in FIG. 12, which also corresponds to region 1120 in FIG. 11, can be introduced after the growth or deposition of the gate dielectric material. It will be appreciated that the gate dielectric 1114 and the gate electrode 1116 can be formed by applying a thin layer of gate dielectric material over the substrate 1102 and then forming a layer of gate electrode material over the layer of gate dielectric material. The layer of gate electrode material and the thin layer of gate dielectric material are then patterned to form the gate electrode 1116 and the thin gate dielectric 1114. The layer of gate electrode material can comprise any suitable conductive material (e.g., a polysilicon based material, a metal, a metal silicide), and can be formed to a thickness of between about 200 to about 5000 Angstroms, for example. The layer of gate electrode material may include a dopant, such as a p type dopant (e.g., Boron) or n type dopant (e.g., Phosphorus), depending upon the type(s) of transistors to be formed, and the dopant can be in the layer as originally applied, or subsequently added thereto. The thin layer of gate dielectric material can comprise any suitable non conductive material (e.g., an oxide based material), and can be formed by a thermal oxidation process, for example, to a thickness of between about 20 Angstroms and about 500 Angstroms at a temperature of between about 800 degrees Celsius and about 1000 degrees Celsius in the presence of $O_2$, for example.

After the gate dielectric 1114 and gate electrode 1116 are formed, third and fourth implantation processes are performed to establish the third concentration (N+) extension regions 1108, 1110 and the fourth concentration (N++) source 1104 and drain 1106 regions, respectively. It will be appreciated that during the third and fourth implantation processes, the gate blocks dopant atoms from impinging upon the area of the substrate 1102 where the channel region 1112 is formed. Some dopant atoms of the extension regions 1108, 1110 may, however, slightly diffuse laterally into the channel region 1112, such as during a subsequent 'activation' heat treatment, for example. Generally, sidewall spacers (not shown) are formed adjacent to the gate and serve to block dopant atoms from the fourth implantation process (that are used to establish the fourth concentration (N++) source 1104 and drain 1106 regions) from impinging upon the area of the substrate 1102 wherein the extension regions 1108, 1110 are formed. Thereafter, silicide, metallization, and/or other back end processing can be performed. By way of example the first concentration may correspond to a concentration of between about $10^{15}$ and about $10^{17}$ dopant atoms per cubic centimeter, the second concentration may correspond to a concentration of between about $2\times10^{17}$ and about $5\times10^{18}$ dopant atoms per cubic centimeter, the third concentration may correspond to a concentration of between about $5\times10^{18}$ and about $5\times10^{19}$ dopant atoms per cubic centimeter and the fourth concentration may correspond to a concentration of between about $10^{19}$ and about $2\times10^{20}$ dopant atoms per cubic centimeter.

FIGS. 13 and 14 illustrate a second exemplary multi gate transistor device 1100 formed according to one or more aspects of the present invention. The transistor 1100 is formed as described above with regard to FIGS. 11 and 12, except that a tilted implantation process is not available so that the second implantation process is essentially vertical. In this manner, the second implantation process merely treats some of about the upper half 1130 of the channel region 1112 to impart the second doping concentration of N therein (rather than treating the top 1124 and sidewalls 1126 of the channel region 1112 as presented in FIG. 12). Consequently, about the bottom half 1132 of the channel region 1112 possess the first concentration of N− or P (rather than merely the bottom center portion 1122 of the channel region 1112 as illustrated in FIG. 12).

Figure 15:
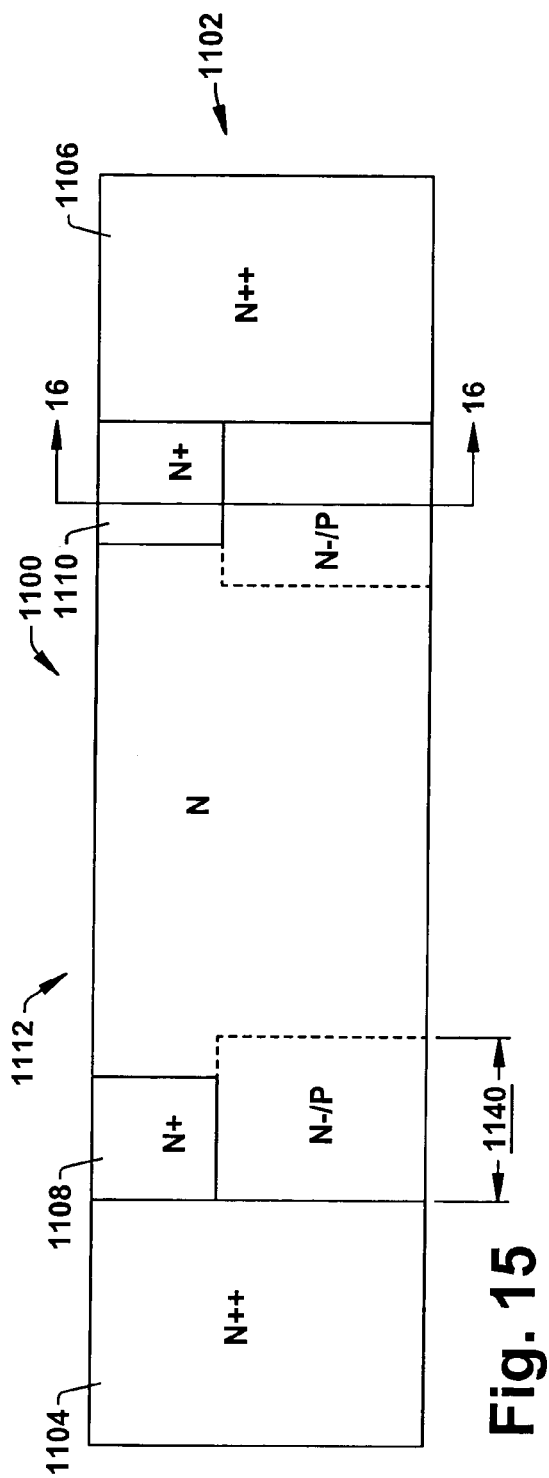
FIG. 15 is a side view illustration of a third exemplary accumulation mode multi gate transistor device formed in accordance with one or more aspects of the present invention.
Figure 16:
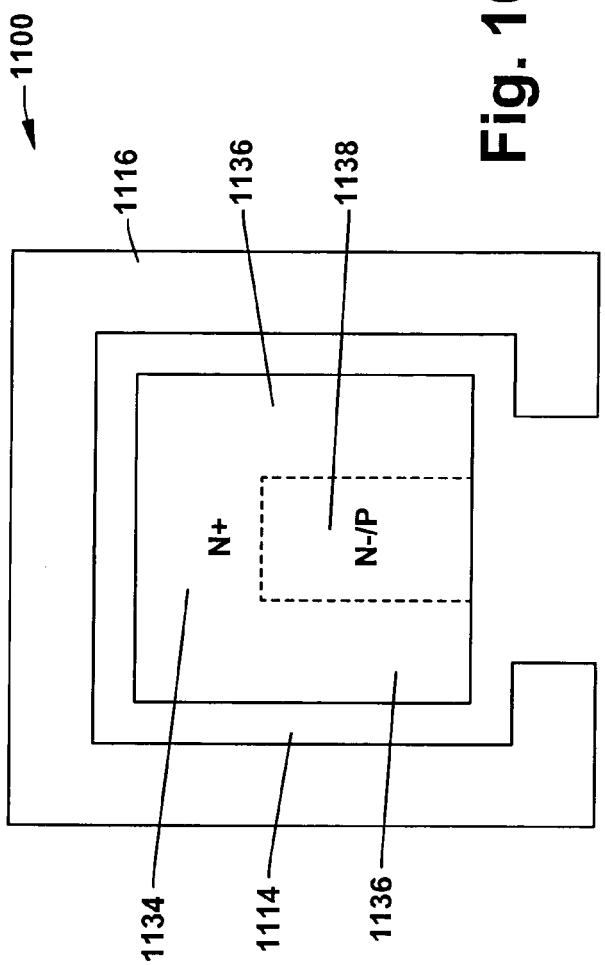
FIG. 16 is a cross sectional illustration of the transistor in FIG. 15 taken along lines 16-16.

FIGS. 15 and 16 illustrate a third exemplary multi gate transistor device 1100 formed according to one or more aspects of the present invention. The transistor 1100 is formed as described above with regard to FIGS. 11 and 12, except that at least some of one or more of the extension regions 1108, 1110 are doped to mitigate short channel effects, rather than the channel region 1112. For example, the entire substrate can initially be uniformly doped by the first implantation process to establish the first lower dopant concentration (N− or P) therein. The second implantation process can then be used to selectively dope the channel region 1112 to achieve the second dopant concentration of N. After the gate dielectric 1114 and the gate electrode 1116 are formed, the third implantation process can be performed to establish the third dopant concentration of N+. In the illustrated example, the third implantation process implements tilted implants such that the top 1134 and sidewalls 1136 of one or more of the extension regions 1108, 1110 have the third dopant concentration, while a bottom center portion 1138 of one or more of the extension regions 1108, 1110 retains the first dopant concentration (N− or P). The fourth implantation process is then performed to form the fourth dopant concentration of N++ within the source 1104 and drain 1106 regions (generally after sidewall spacers are formed adjacent to the gate). It will be appreciated that the amount (e.g., length) 1140 of one or more of the extension regions 1108, 1110 that is doped merely has to be long enough to mitigate short channel effects, rather than the entirety of either of the extension regions 1108, 1110.

Figure 17:
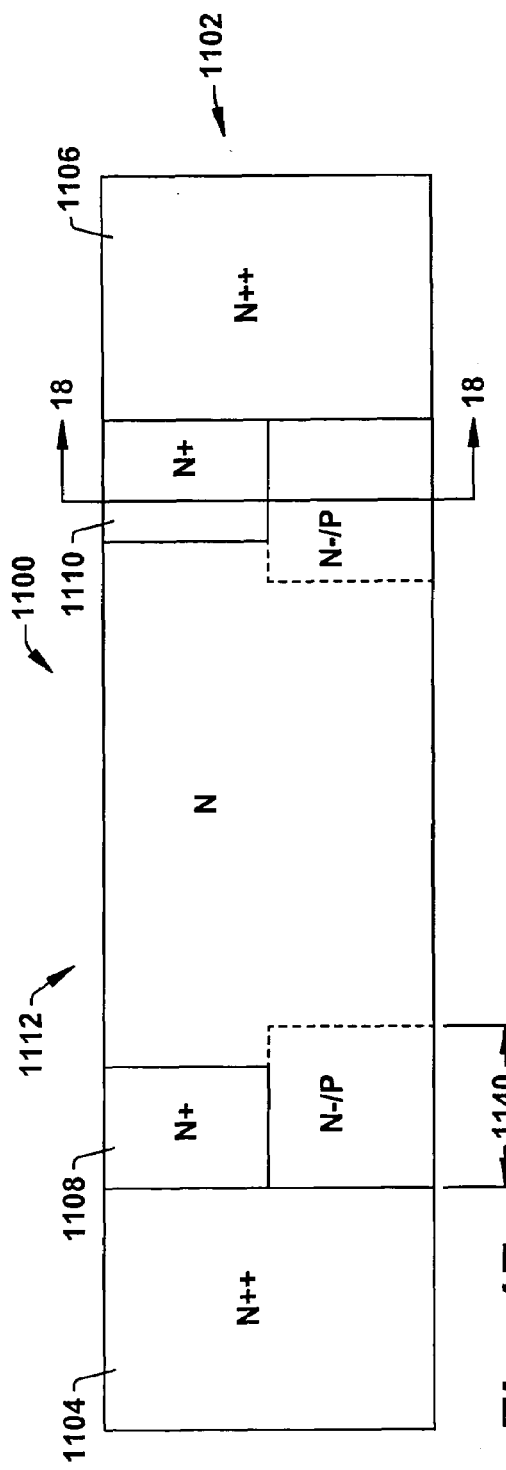
FIG. 17 is a side view illustration of a fourth exemplary accumulation mode multi gate transistor device formed in accordance with one or more aspects of the present invention.
Figure 18:
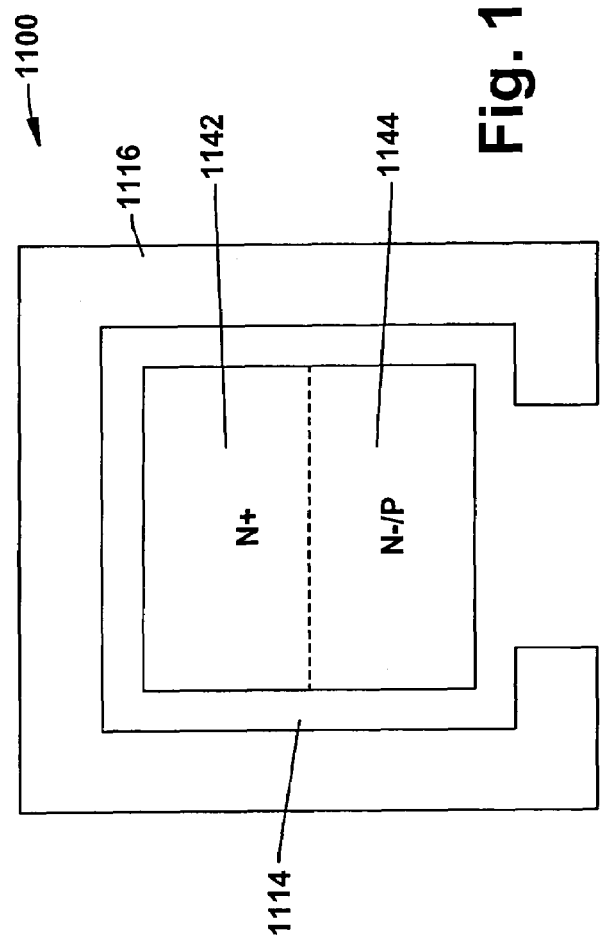
FIG. 18 is a cross sectional illustration of the transistor in FIG. 17 taken along lines 18-18.

FIGS. 17 and 18 illustrate a fourth exemplary multi gate transistor device 1100 formed according to one or more aspects of the present invention. The transistor 1100 is similar to that described with regard to FIGS. 15 and 16, but employs a non-tilted implant (as described above with regard to FIGS. 13 and 14). Accordingly, the third implantation process merely treats some of about the upper half 1142 of one or more of the extension regions 1108, 1110 to instill the third doping concentration of N+ therein (rather than treating the top 1134 and sidewalls 1136 of one or more of the extension regions 1108, 1110 as presented in FIG. 16). The respective about bottom halves 1144 of the extension regions 1108, 1110 thus remain at the first dopant concentration of N− or P.

Figure 19:
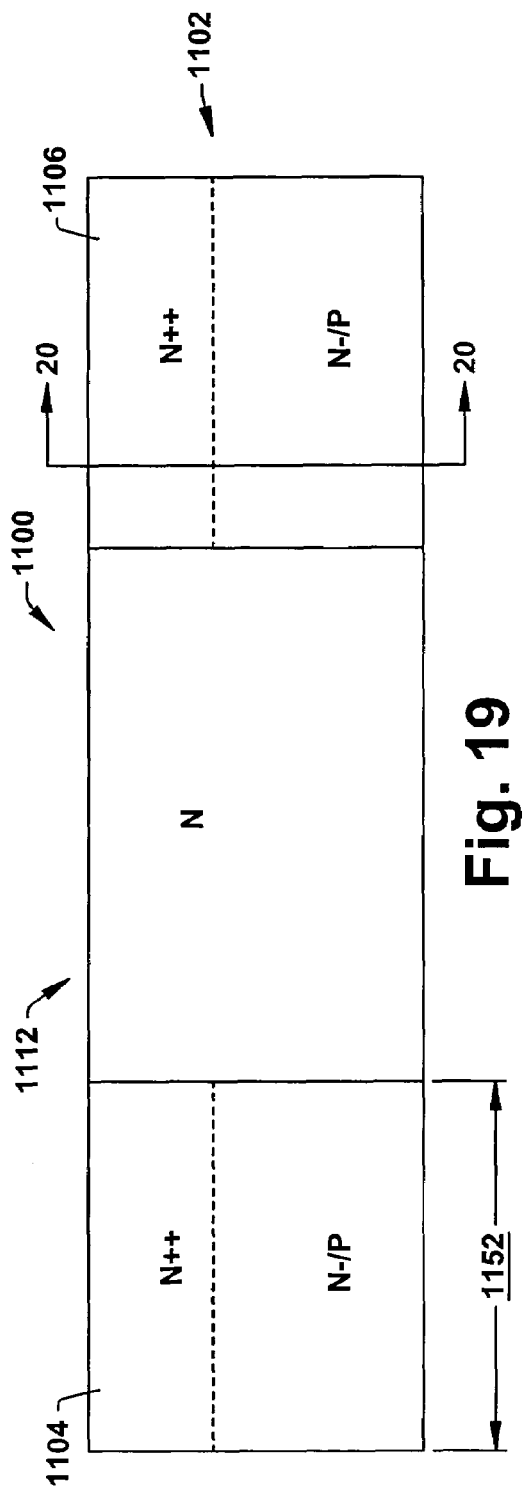
FIG. 19 is a side view illustration of a fifth exemplary accumulation mode multi gate transistor device formed in accordance with one or more aspects of the present invention.
Figure 20:
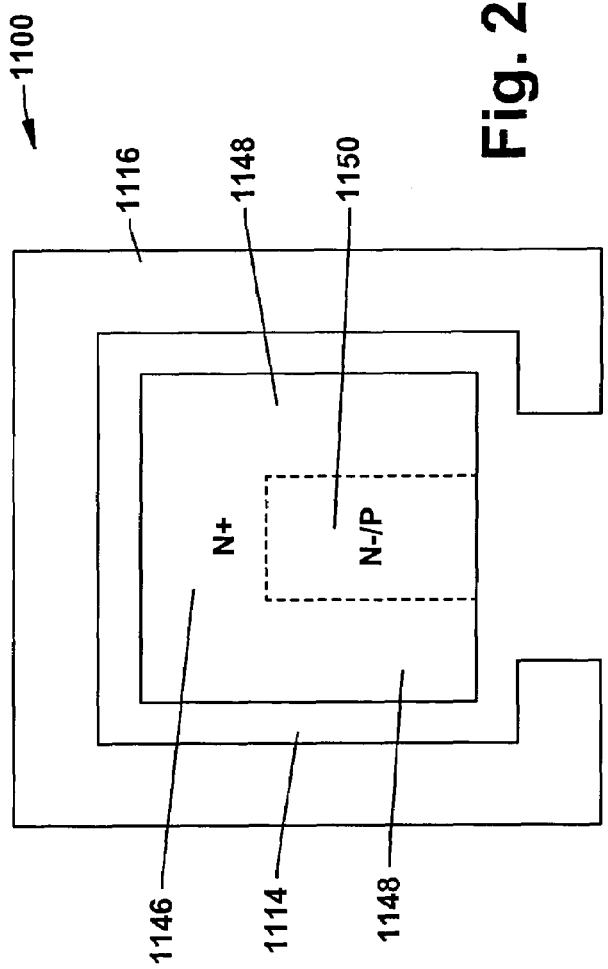
FIG. 20 is a cross sectional illustration of the transistor in FIG. 19 taken along lines 20-20.

FIGS. 19 and 20 illustrate a fifth exemplary multi gate transistor device 1100 formed according to one or more aspects of the present invention. In this example, at least some of the source 1104 and drain 1106 regions include alternative dopings to mitigate short channel effects and the transistor lacks extension regions. Accordingly, the entire substrate can initially be uniformly doped by the first implantation process to establish the first lower dopant concentration (N− or P) therein. The second implantation process can then be used to selectively dope the channel region 1112 to achieve the second dopant concentration of N. The third implantation process is omitted since there are no extension regions. As such, after the gate dielectric 1114 and the gate electrode 1116 are formed, a tilted fourth implantation process can be performed to establish the fourth dopant concentration of N++ within at least some of the source 1104 and/or drain 1106 regions. In the illustrated example, the tilted fourth implantation process imparts the fourth doping concentration along top 1146 and sidewall 1148 regions of the source 1104 and/or drain 1106 regions. In this manner, a bottom center portion 1150 of the source 1104 and/or drain 1106 regions retains the first dopant concentration (N− or P). It will be appreciated that the amount (e.g., length) 1152 of the source 1104 and/or drain 1106 regions that is doped merely has to be long enough to mitigate short channel effects, rather than the entirety of the source 1104 and/or drain 1106 regions.

FIGS. 21 and 22 illustrate a sixth exemplary multi gate transistor device 1100 formed according to one or more aspects of the present invention. The transistor 1100 is similar to that described with regard to FIGS. 15 and 16 in that the transistor lacks extension regions and has doped source 1104 and/or drain 1106 regions to mitigate short channel effects. However, a tilted implant is not used in this example. Accordingly, instead of doping the top 1146 and sidewalls 1148 of the source 1104 and/or drain 1106 regions (FIG. 20), the fourth implantation process merely dopes at least some of about the upper half 1154 of the source 1104 and/or drain 1106 regions to instill the fourth doping concentration therein. In this manner, about the bottom half 1156 of the source 1104 and/or drain 1106 regions remain at the first dopant concentration (N− or P).

FIGS. 23-34 illustrate further exemplary multi gate transistor devices formed in accordance with one or more aspects of the present invention, wherein source 1104 and drain 1106 regions comprise one or more metals rather than (doped) silicon. Metal source and drain regions are generally used in transistors to improve source and drain resistance. The metals used are 'real' metals such as platinum or tungsten, and compounds that possess electrical properties similar to those of metals. This includes metal silicides such as titanium, molybdenum, cobalt, nickel, iridium, platinum, erbium, yttrium and other rare-earth metal silicides. It also includes metal silicides involving a combination of these metals, such as platinum-erbium silicide, and compounds where germanium is substituted to silicon, such as germanium-platinum and germanium-silicon-platinum-erbium compounds. These compounds can be doped or undoped, and part of their doping impurities may diffuse in the silicon or not. The contact between the metal and the silicon may be either of the ohmic type or the Schottky type.

FIGS. 23 and 24 illustrate a seventh exemplary multi gate transistor device 1100 formed according to one or more aspects of the present invention. The transistor 1100 is similar to that described with regard to FIGS. 11 and 12 in that at least some of an upper portion 1158 of the channel region 1112 is doped to have the second doping concentration of N. This is accomplished by using a tilted second implantation process to impart the second doping concentration within at least some of the top 1160 and sidewalls 1162 of the channel region 1112 after the entire substrate is uniformly doped by a first implantation process to have the first dopant concentration. As such, at least some of the bottom center 1164 portion of the channel region 1112 remains at the first dopant concentration of N− or P. A third implantation process is then performed, generally after the gate dielectric 1114 and gate electrode 1116 are formed, to establish extension regions 1108, 1110. A fourth implantation process is not illustrated since the metal source 1104 and drain 1106 regions are not doped. As described above with regard to FIGS. 11 and 12, the entire length 1166 does not need to be doped to mitigate short channel effects. Rather, merely enough of the channel region 1112 has to be doped to interrupt the formation of a conduction path therein.

Figure 25:
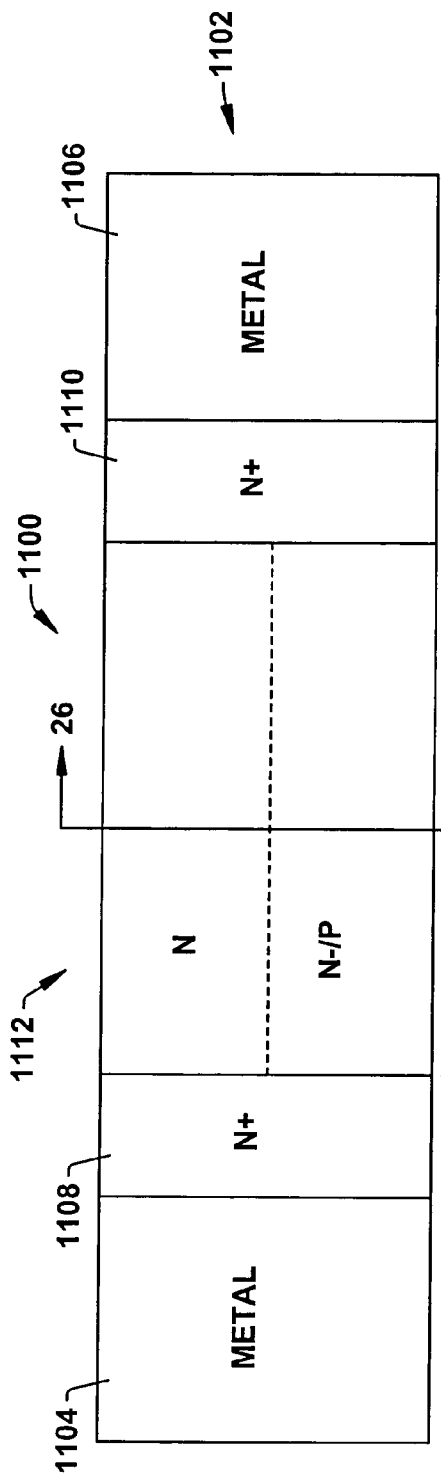
FIG. 25 is a side view illustration of an eighth exemplary accumulation mode multi gate transistor device formed in accordance with one or more aspects of the present invention.
Figure 26:
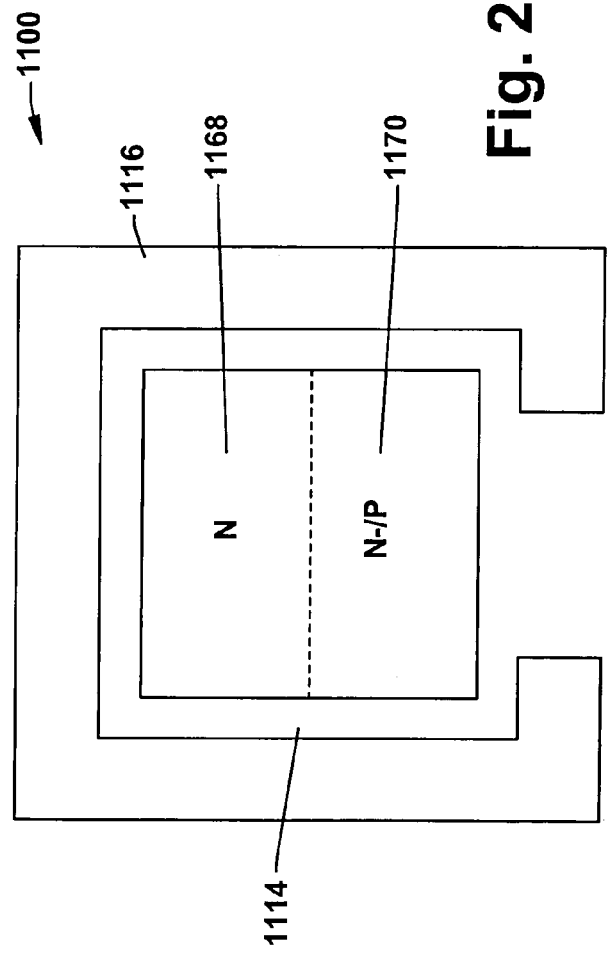
FIG. 26 is a cross sectional illustration of the transistor in FIG. 25 taken along lines 26-26.

FIGS. 25 and 26 illustrate an eighth exemplary multi gate transistor device 1100 formed according to one or more aspects of the present invention. The transistor 1100 is similar to that described with regard to FIGS. 23 and 24 in that the channel region 1112 is once again doped to mitigate short channel effects, but that a tilted implantation process is not implemented. Accordingly, a substantially vertical second implantation process imparts the second doping concentration of N to at least some of about the upper half 1168 of the channel region 1112, while about a lower half 1170 of the channel region remains at the first dopant concentration of N− or P. This is followed by a third implantation process that establishes the extension regions 1108, 1110 having the third doping concentration of N+.

Figure 27:
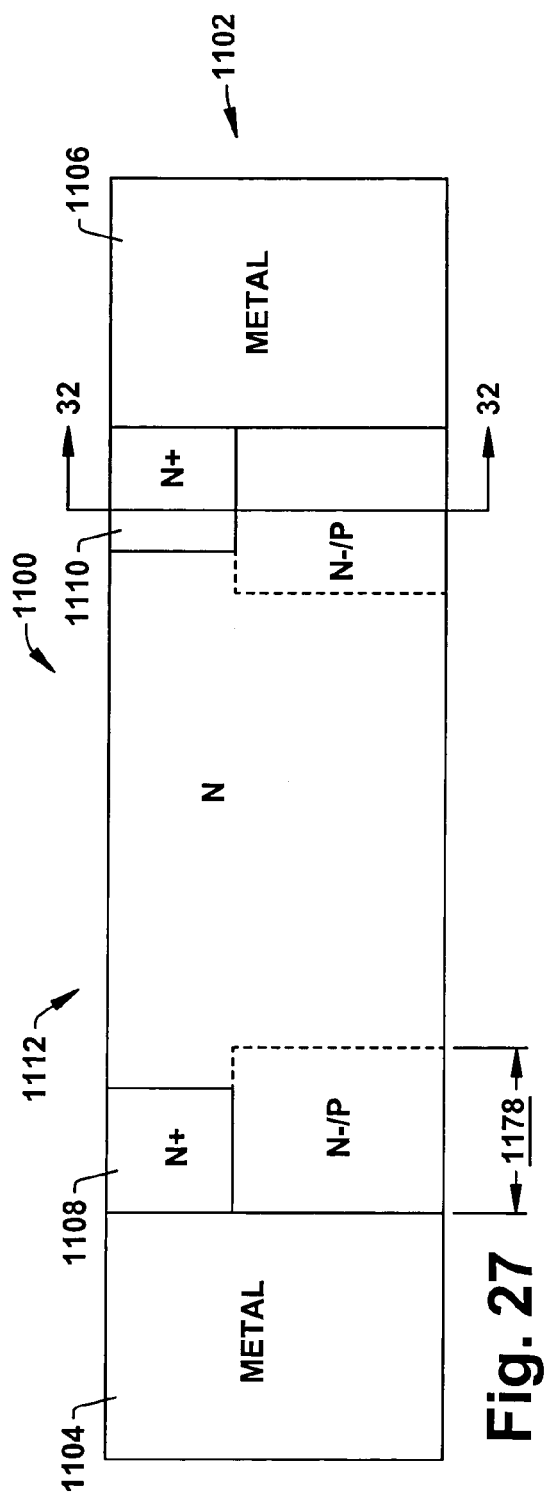
FIG. 27 is a side view illustration of a ninth exemplary accumulation mode multi gate transistor device formed in accordance with one or more aspects of the present invention.
Figure 28:
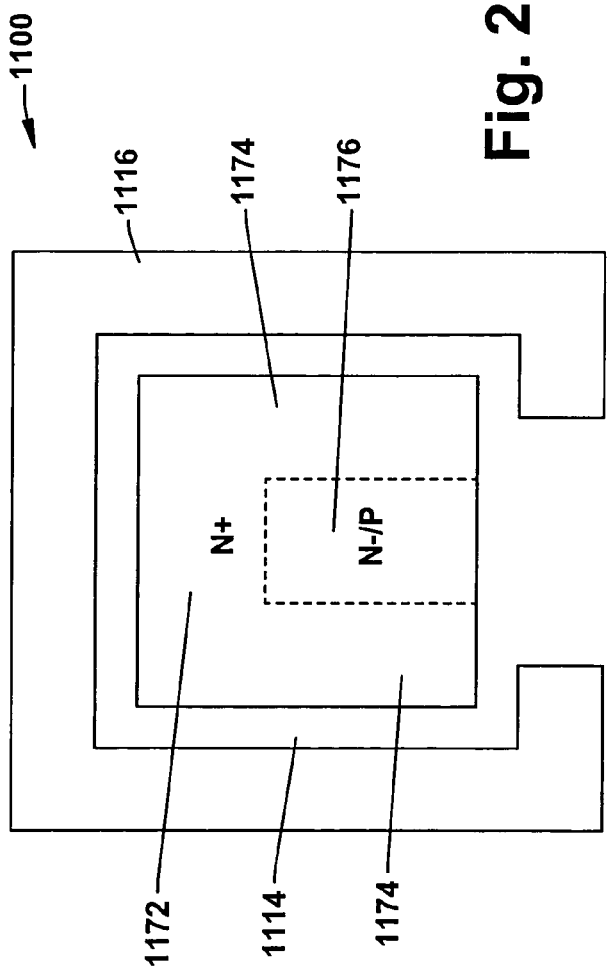
FIG. 28 is a cross sectional illustration of the transistor in FIG. 27 taken along lines 28-28.

FIGS. 27 and 28 illustrate a ninth exemplary multi gate transistor device 1100 formed according to one or more aspects of the present invention. The transistor 1100 is similar to that described with regard to FIGS. 15 and 16, in that at least some of one or more extension regions 1108, 1110 are doped to mitigate short channel effects. Accordingly, after doping with a first implant to uniformly achieve the first doping concentration, performing a second implant to achieve the second doping concentration (in the channel region 1112), and then forming the gate dielectric 1114 and gate electrode 1116, the third implantation process can be performed to establish the third dopant concentration in at least some of one or more of the extension regions 1108, 1110. A tilted implant is used in the third implantation process so that at least some of the top 1172 and sidewalls 1174 of one or more of the extension regions 1108, 1110 have the third dopant concentration, while a bottom center portion 1176 of one or more of the extension regions 1108, 1110 retains the first dopant concentration (N− or P). Also, the amount (e.g., length) 1178 of one or more of the extension regions 1108, 1110 that is doped merely has to be long enough to mitigate short channel effects, rather than the entirety of either of the extension regions 1108, 1110.

FIGS. 29 and 30 illustrate a tenth exemplary multi gate transistor device 1100 formed according to one or more aspects of the present invention. The transistor 1100 is similar to that described with regard to FIGS. 17 and 18 in that at least some of one or more extension regions 1108, 1110 are doped to mitigate short channel effects, but a tilted implant is not implemented. As such, the device is formed as described above with regard FIGS. 27 and 28 except that the third implantation process is substantially vertical so that at least some of about the upper half 1180 of one or more of the extension regions 1108, 1110 is treated to instill the third doping concentration of N+ therein. As such, the respective about bottom halves 1182 of the extension regions 1108, 1110 thus remain at the first dopant concentration of N− or P.

Figure 31:
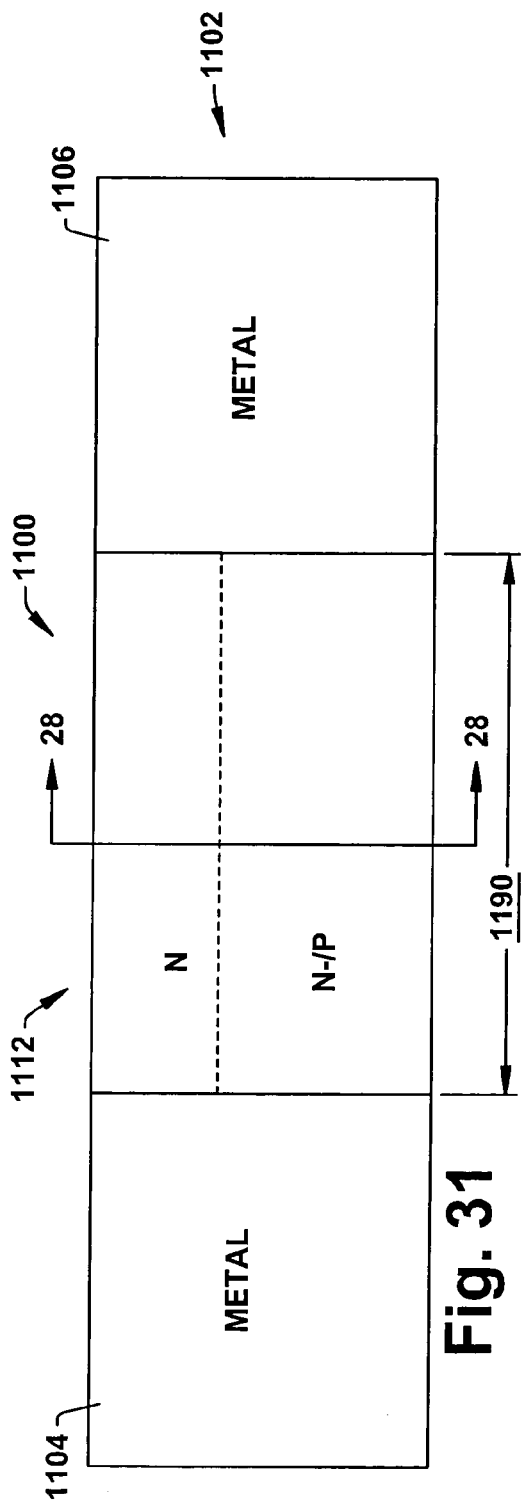
FIG. 31 is a side view illustration of an eleventh exemplary accumulation mode multi gate transistor device formed in accordance with one or more aspects of the present invention.
Figure 32:
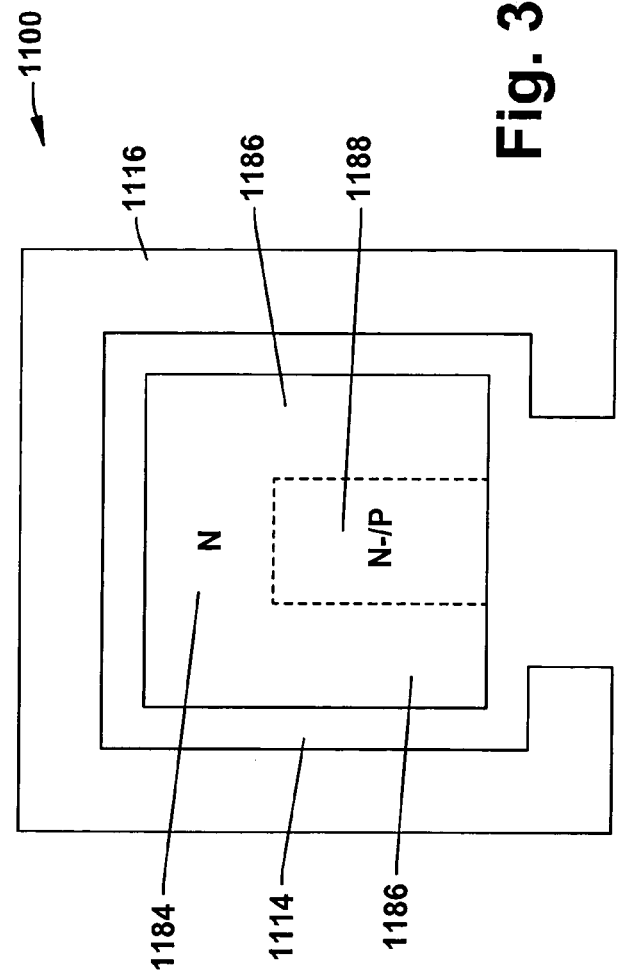
FIG. 32 is a cross sectional illustration of the transistor in FIG. 31 taken along lines 32-32.

FIGS. 31 and 32 illustrate an eleventh exemplary multi gate transistor device 1100 formed according to one or more aspects of the present invention. The transistor 1100 is similar to that described with regard to FIGS. 23 and 24 in that at least a portion of the channel region 1112 is doped to mitigate short channel effects. However, extension regions are not present in this example. In this manner, a third implantation process is not implemented, nor is a fourth one since metal source 1104 and drain 110 regions are used. Here, the second implantation process is tilted so that the second doping concentration of N is imparted into top 1184 and sidewall 1186 portions of at least some of the channel region 1112. As such, the bottom center 1188 portion of the channel region 1112 remains at the first dopant concentration of N− or P established by a uniform first implantation process. Again, the entire length 1190 of the channel region 1112 does not need to be doped to mitigate short channel effects. Rather, merely enough of the channel region 1112 has to be doped to interrupt the formation of a conduction path therein.

FIGS. 33 and 34 illustrate a twelfth exemplary multi gate transistor device 1100 formed according to one or more aspects of the present invention. The transistor 1100 is similar to that described with regard to FIGS. 31 and 32, except that a tilted implant is not implemented in the second implantation process. Rather, the second implantation process is substantially vertical so that about the upper half 1192 of at least some of the channel region 1112 is doped to have the second doping concentration. Accordingly, about the lower half 1194 of the channel region 1112 is left at the first dopant concentration formed by the uniform first implantation process.

It will be appreciated that while particular dopant types are illustrated herein, that one or more aspects of the present invention are not to be limited thereby. For example, a p type source/drain implant (e.g., Boron (B and/or $BF_2$)) can be implemented in accordance with the teachings herein for PMOS transistor devices, for example. Similarly, an n type source/drain implant (e.g., Phosphorous (P) and/or Arsenic (As)) can be implemented in accordance with the teachings herein for NMOS transistor devices, for example. Likewise, while one type of multi gate transistor device may be referenced herein, one or more aspects of the present invention have application to any type of multi gate transistor devices, including, but not limited to, dual gate transistors, triple gate transistors, quad gate transistors, PI gate transistors and omega gate transistors, for example. Furthermore, it will be appreciated that the channel dopings provided herein can be simply, efficiently and inexpensively implemented into a CMOS fabrication process. It is also to be appreciated that layers and/or elements depicted herein are illustrated with particular dimensions relative to one another (e.g., layer to layer dimensions and/or orientations) for purposes of simplicity and ease of understanding and that actual dimensions of the elements may differ substantially from that illustrated herein.

Additionally, unless stated otherwise and/or specified to the contrary, any one or more of the layers set forth herein can be formed in any number of suitable ways, such as with spin on techniques, sputtering techniques (e.g., magnetron and/or ion beam sputtering), (thermal) growth techniques and/or deposition techniques such as atomic layer deposition (ALD), chemical vapor deposition (CVD), physical vapor deposition (PVD), atmospheric pressure CVD (APCVD), low pressure CVD (LPCVD), metal organic CVD (MOCVD) and/or plasma enhanced CVD (PECVD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a multi gate transistor device, comprising:
    performing a first implantation process to achieve a first doping concentration within a semiconductor substrate;
    performing a second implantation process to achieve a second doping concentration within an area of the semiconductor substrate wherein a channel region of the transistor is to be established, the second implantation process merely doping a portion of the area;
    forming a multi gate dielectric over the area of the semiconductor substrate wherein the channel region of the transistor is established;
    forming a multi gate electrode over the gate dielectric;
    performing a third implantation process to establish a first extension region adjacent to a first side of the channel region and a second extension region adjacent to a second side of the channel region, the first and second extension regions having a third doping concentration; and
    performing a fourth implantation process to establish a source region adjacent to the first extension region and a drain region adjacent to the second extension region, the source and drain regions having a fourth doping concentration, wherein the fourth doping concentration is greater than the third doping concentration, the third doping concentration is greater than the second doping concentration and the second doping concentration is greater than the first doping concentration.

2. The method of claim 1, wherein the portion corresponds to at least some of top and sidewall regions of the area, such that at least some of a bottom center region of the area is maintained at the first doping concentration.

3. The method of claim 2, wherein the second implantation process implements a tilted implantation process.

4. The method of claim 1, wherein the portion corresponds to at least some of about an upper half of the area so that at least some of about a lower half of the area is maintained at the first doping concentration.

5. A method of forming a multi gate transistor device, comprising:
  performing a first implantation process to achieve a first doping concentration within a semiconductor substrate;
  performing a second implantation process to achieve a second doping concentration within an area of the semiconductor substrate wherein a channel region of the transistor is to be established;
  forming a multi gate dielectric over the area of the semiconductor substrate wherein the channel region of the transistor is established;
  forming a multi gate electrode over the gate dielectric;
  performing a third implantation process to establish a first extension region adjacent to a first side of the channel region and a second extension region adjacent to a second side of the channel region, the third implantation process establishing a third doping concentration, and the third implantation process merely doping a portion of one or both of the first extension region and the second extension region; and
  performing a fourth implantation process to establish a source region adjacent to the first extension region and a drain region adjacent to the second extension region, the source and drain regions having a fourth doping concentration, wherein the fourth doping concentration is greater than the third doping concentration, the third doping concentration is greater than the second doping concentration and the second doping concentration is greater than the first doping concentration.

6. The method of claim 5, wherein the portion corresponds to at least some of top and sidewall regions of one or both of the first extension region and the second extension region, such that at least some of a bottom center region of one or both of the first and second extension regions is maintained at the first doping concentration.

7. The method of claim 6, wherein the third implantation process implements a tilted implantation process.

8. The method of claim 5, wherein the portion corresponds to at least some of about an upper half of one or both of the first and second extension regions so that at least some of about a lower half of one or both of the first and second extension regions is maintained at the first doping concentration.

9. A method of forming a multi gate transistor device, comprising:
  performing a first implantation process to achieve a first doping concentration within a semiconductor substrate;
  performing a second implantation process to achieve a second doping concentration within an area of the semiconductor substrate wherein a channel region of the transistor is to be established;
  forming a multi gate dielectric over the area of the semiconductor substrate wherein the channel region of the transistor is established;
  forming a multi gate electrode over the gate dielectric; and
  performing a fourth implantation process to establish a source region adjacent to a first side of the channel region and a drain region adjacent to a second side of the channel region, the fourth implantation process establishing a fourth doping concentration, and the fourth implantation process merely doping a portion of one or both of the source and drain regions, wherein the fourth doping concentration is greater than the second doping concentration and the second doping concentration is greater than the first doping concentration.

10. The method of claim 9, wherein the portion corresponds to at least some of top and sidewall regions of one or both of the source and drain regions, such that at least some of a bottom center region of one or both of the source and drain regions is maintained at the first doping concentration.

11. The method of claim 10, wherein the fourth implantation process implements a tilted implantation process.

12. The method of claim 9, wherein the portion corresponds to at least some of about an upper half of one or both of the source and drain regions so that at least some of about a lower half of one or both of the source and drain regions is maintained at the first doping concentration.

13. A method of forming a multi gate transistor device, comprising:
  performing a first implantation process to achieve a first doping concentration within a semiconductor substrate;
  performing a second implantation process to achieve a second doping concentration within an area of the semiconductor substrate wherein a channel region of the transistor is to be established, the second implantation process merely doping a portion of the area;
  forming a multi gate dielectric over the area of the semiconductor substrate wherein the channel region of the transistor is established;
  forming a multi gate electrode over the gate dielectric;
  performing a third implantation process to establish a first extension region adjacent to a first side of the channel region and a second extension region adjacent to a second side of the channel region, the first and second extension regions having a third doping concentration; and
  forming a metal source region adjacent to the first extension region and a metal drain region adjacent to the second extension region, wherein the third doping concentration is greater than the second doping concentration and the second doping concentration is greater than the first doping concentration.

14. The method of claim 13, wherein the portion corresponds to at least some of top and sidewall regions of the area, such that at least some of a bottom center region of the area is maintained at the first doping concentration.

15. The method of claim 14, wherein the second implantation process implements a tilted implantation process.

16. The method of claim 13, wherein the portion corresponds to at least some of about an upper half of the area so that at least some of about a lower half of the area is maintained at the first doping concentration.

17. A method of forming a multi gate transistor device, comprising:
  performing a first implantation process to achieve a first doping concentration within a semiconductor substrate;
  performing a second implantation process to achieve a second doping concentration within an area of the semiconductor substrate wherein a channel region of the transistor is to be established;
  forming a multi gate dielectric over the area of the semiconductor substrate wherein the channel region of the transistor is established;
  forming a multi gate electrode over the gate dielectric;
  performing a third implantation process to establish a first extension region adjacent to a first side of the channel region and a second extension region adjacent to a second side of the channel region, the third implantation process establishing a third doping concentration, and the third implantation process merely doping a portion of one or both of the first extension region and the second extension region; and forming a metal source region adjacent to the first extension region and a metal drain region adjacent to the second extension region, wherein the third doping concentration is greater than the second doping concentration and the second doping concentration is greater than the first doping concentration.

18. The method of claim 17, wherein the portion corresponds to at least some of top and sidewall regions of one or both of the first extension region and the second extension region, such that at least some of a bottom center region of one or both of the first and second extension regions is maintained at the first doping concentration.

19. The method of claim 18, wherein the third implantation process implements a tilted implantation process.

20. The method of claim 17, wherein the portion corresponds to at least some of about an upper half of one or both of the first and second extension regions so that at least some of about a lower half of one or both of the first and second extension regions is maintained at the first doping concentration.

* * * * *